United States Patent
Beall

(10) Patent No.: US 10,462,925 B1
(45) Date of Patent: Oct. 29, 2019

(54) MASS STORAGE DEVICE RETAINER ASSEMBLY

(71) Applicant: Amazon Technologies, Inc., Seattle, WA (US)

(72) Inventor: Christopher Strickland Beall, Woodinville, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/489,689

(22) Filed: Apr. 17, 2017

Related U.S. Application Data

(63) Continuation of application No. 14/668,730, filed on Mar. 25, 2015, now Pat. No. 9,629,275.

(51) Int. Cl.
*H05K 5/00* (2006.01)
*H05K 7/14* (2006.01)

(52) U.S. Cl.
CPC ......... *H05K 7/1487* (2013.01); *H05K 7/1401* (2013.01); *H05K 7/1438* (2013.01)

(58) Field of Classification Search
CPC ...................................... G06F 1/187
USPC .................................... 361/679.21
See application file for complete search history.

(56) References Cited

U.S. PATENT DOCUMENTS

| 5,506,750 A | 4/1996 | Carteau et al. |
|---|---|---|
| 7,864,539 B2 | 1/2011 | Dunham et al. |
| 8,720,043 B2 | 5/2014 | Corddry et al. |
| 8,743,549 B2 | 6/2014 | Frink et al. |
| 2007/0233781 A1* | 10/2007 | Starr ............ G11B 33/126 709/203 |
| 2009/0097196 A1 | 4/2009 | Peng et al. |
| 2011/0173805 A1 | 7/2011 | Richet et al. |
| 2011/0310550 A1 | 12/2011 | Xu et al. |
| 2013/0141863 A1 | 6/2013 | Ross et al. |
| 2015/0293566 A1* | 10/2015 | Ehlen ............ G06F 1/187 361/679.33 |
| 2016/0128237 A1 | 5/2016 | Szeremeta |

OTHER PUBLICATIONS

SFF Cemmittes, "SFF-8391 Specificatian for 3.5" Farm Factor Drive: Dimensions" 9 pages (Aug. 30, 2014),

* cited by examiner

*Primary Examiner* — Jerry Wu
(74) *Attorney, Agent, or Firm* — Klarquist Sparkman, LLP

(57) ABSTRACT

A carrierless mass storage device retainer assembly for retaining a carrierless mass storage device in a vertical orientation comprises a generally horizontal supporting surface, a generally vertical backplane and a retainer. The supporting surface is configured to receive a first side surface of a carrierless mass storage device and to support it from below with its second side surface facing upwards in a generally vertical direction. The backplane is positioned adjacent an end of the horizontal supporting surface and has a connector configured to establish an electrical connection between the carrierless mass storage device and the backplane. The retainer comprises a bail coupled to the supporting surface and shaped to extend around the carrierless mass storage device and to contact at least its second side surface when it is installed.

17 Claims, 14 Drawing Sheets

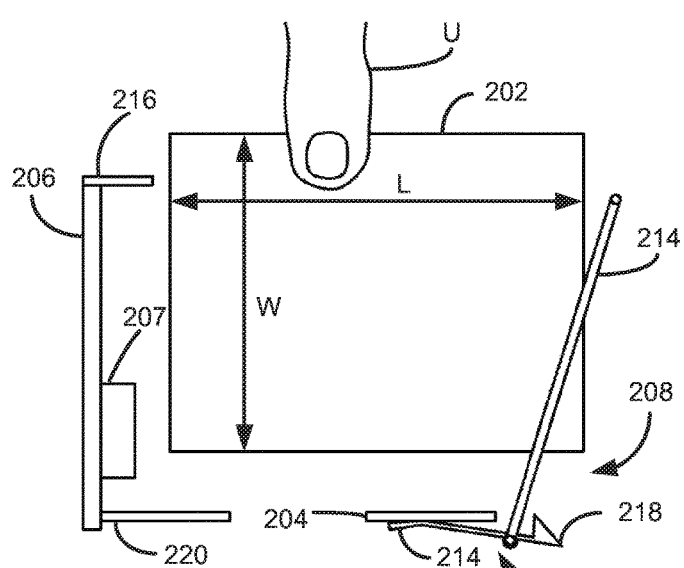 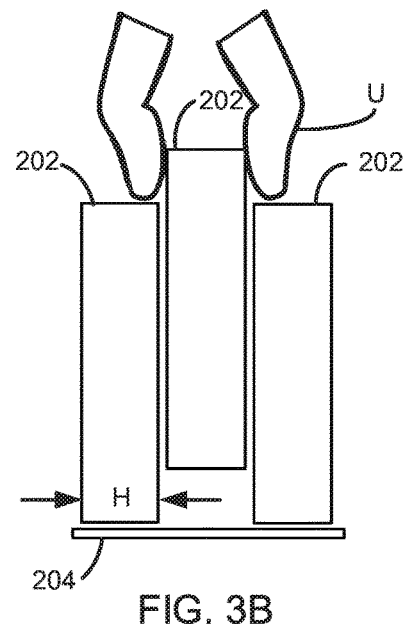
FIG. 3A  FIG. 3B
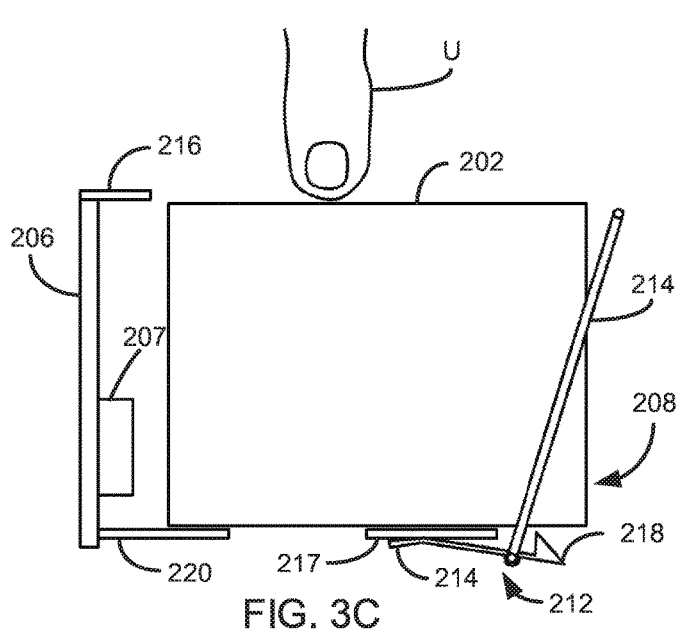 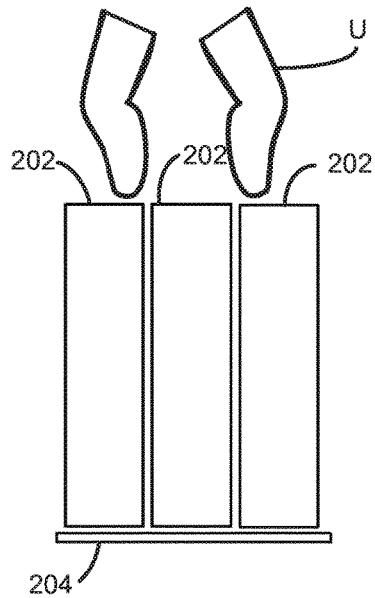
FIG. 3C  FIG. 3D

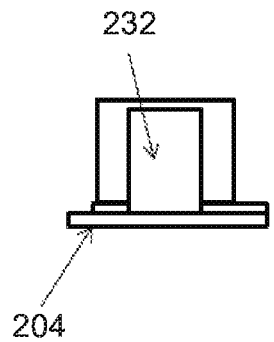 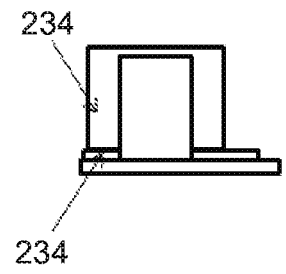
FIG. 12A  FIG. 12B
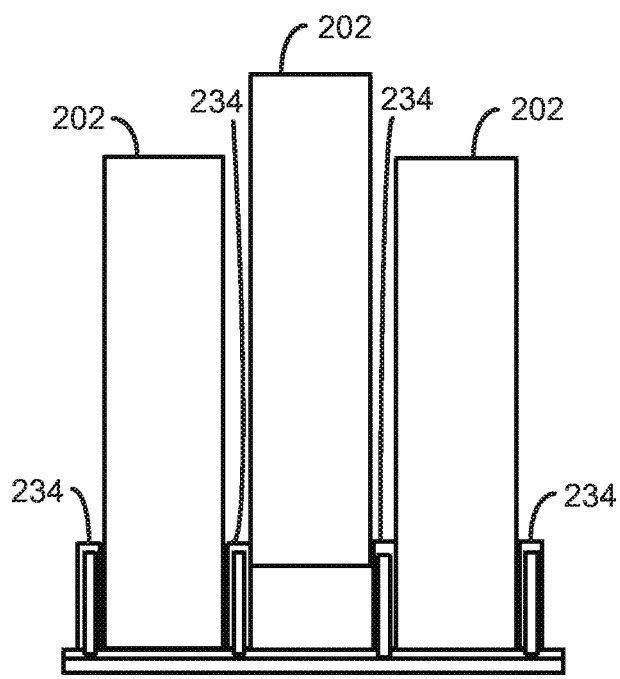
FIG. 12C

MASS STORAGE DEVICE RETAINER ASSEMBLY

CROSS REFERENCE TO RELATED APPLICATION

This application is a continuation of U.S. patent application Ser. No. 14/668,730, filed Mar. 25, 2015, which is hereby incorporated by reference.

BACKGROUND

Organizations such as on-line retailers, Internet service providers, search providers, financial institutions, universities and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks.

Each server rack, in turn, includes many servers and associated computer equipment and computer components. Such components include printed circuit boards, mass storage devices, power supplies and processors, as just a few examples. Some known computer systems include a plurality of such larger, multiple-processor computers that are configured into rack-mounted components, and then are subsequently positioned within a rack system. Some known rack systems include 40 such rack-mounted components.

Some servers include a number of mass storage devices in the form of hard disk drives (for example, eight or more hard disk drives) to provide adequate data storage. Typically, the hard disk drives for servers are of a standard, off-the-shelf type. Standard, off-the-shelf hard disk drives are often a cost effective solution for storage needs because such hard disk drives can be obtained at relatively low cost. Nonetheless, in server designs using such standard hard disk drives, the arrangement of the hard disk drives may leave a substantial amount of wasted space in the server chassis. This wasted space, especially when multiplied over many servers in a rack, may result in inadequate computing or storage capacity for a system.

Conventional solutions for retaining mass storage devices in a supporting chassis or other structure, particularly where they are spaced together very closely, are limited. This is especially true for applications in which the mass storage devices are hard disk drives provided without carriers. Such hard disk drives, also referred to as "carrierless" hard disk drives, can be even more closely spaced because their dimensions are smaller. In a typical application, such mass storage devices do not exceed the standard form factor dimensions, e.g., the 3.5" Form Factor Drive Dimensions as specified in SFF-8301, which is incorporated herein by reference.

BRIEF DESCRIPTION OF THE DRAWINGS

FIGS. 3A and 3B are side elevation and end elevation views, respectively, of a carrierless mass storage device being lowered into position by a user with an embodiment of a retainer shown in a disengaged position.

FIGS. 3C and 3D are side elevation and end elevation views, respectively, showing the carrierless mass storage device after it contacts a horizontal supporting surface.

FIGS. 12A, 12B and 12C are additional elevation views showing additional vibration damping features.

DETAILED DESCRIPTION

Figure 1:
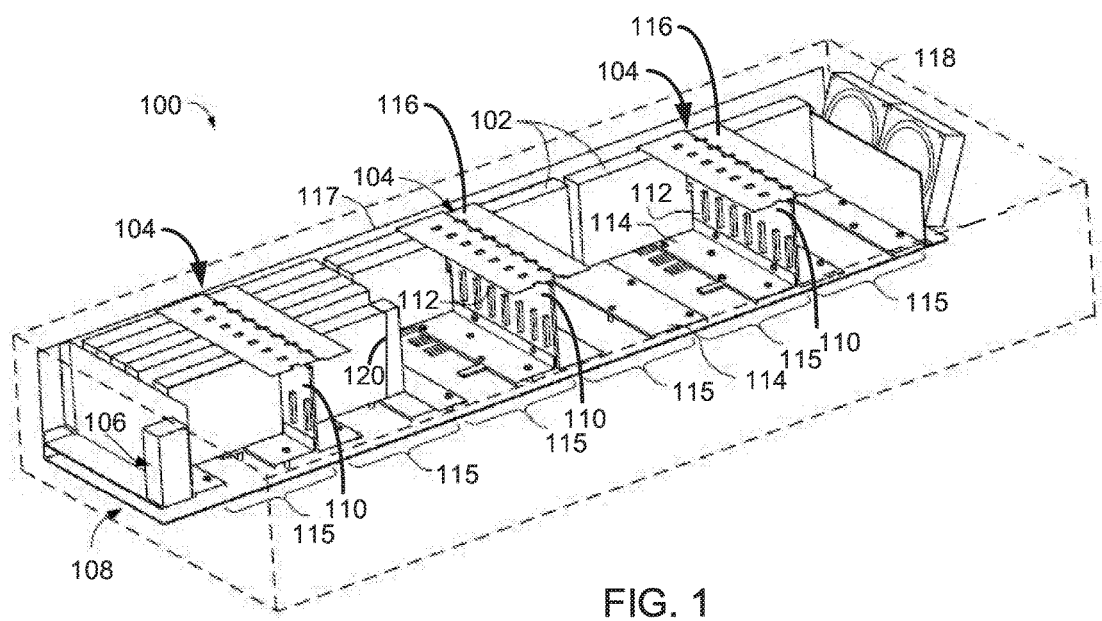
FIG. 1 is a perspective view of one implementation of a data storage module having a plurality of closely spaced carrierless mass storage devices arranged in a vertical orientation.

FIG. 1 illustrates a perspective view of a data storage module 100 according to some embodiments that shows multiple carrierless mass storage devices 102, such as carrierless hard disk drives, installed on multiple vertically-oriented backplanes 104, and at least one power supply unit 106. An electronic components chassis 108, similar to a server chassis and sometimes called an electronics hardware chassis, supports the carrierless mass storage devices 102, backplanes 104 and other components, as is described in detail below. Carrierless hard disk drives, also referred to as bare hard drives, can be advantageous because they occupy less space, are less expensive and are much quicker to install and/or remove. Multiplied over many modules, many racks and many installations, the savings provided by carrierless mass storage devices are considerable.

Each backplane, or backplane circuit board assembly 104, may include a backplane circuit board 110, which is also oriented vertically, to which the carrierless mass storage devices 102 are electrically connected via coupling with complementary circuit board connectors 112. As illustrated, the backplanes 104 are two-sided, but described implementations can also be used with one-sided backplanes. The backplane circuit board assemblies 104 may include one or more horizontally-oriented lower mounting plates 114 upon which the carrierless mass storage devices 102 are mounted, such that the carrierless mass storage devices 102 rest on and transfer at least a portion of their structural load to these lower mounting plates, also referred to herein as support surfaces. In the illustrated implementation, there are also horizontally-oriented upper mounting plates (or members) 116. The lower mounting plates 114 and the upper mounding mounting plates 116 are spaced apart to define a recess for receiving one end of each carrierless mass storage device 102 as it is installed against a respective one of the backplanes 104. Rows of hard disk drive spaces are indicated at 115. The lower mounting plates 114 may be spaced apart horizontally as shown, such that gaps are defined, or a continuous mounting surface may be provided. Air can be moved through the data storage module 100 by one or more air moving devices 118.

The data storage module 100 and/or the electronic component chassis 108 can include other walls, but for the sake of illustration only a representative side wall 117 is shown in FIG. 1. A representative retainer, as described below in greater detail, is shown schematically at 120 for one of the carrierless mass storage devices 102 in its engaged position in which it contacts the carrierless mass storage device 102. The retainer 120 serves to retain the carrierless mass storage device 102 in place and protect it from collisions, side shocks and other undesired forces and movements.

Figure 2:
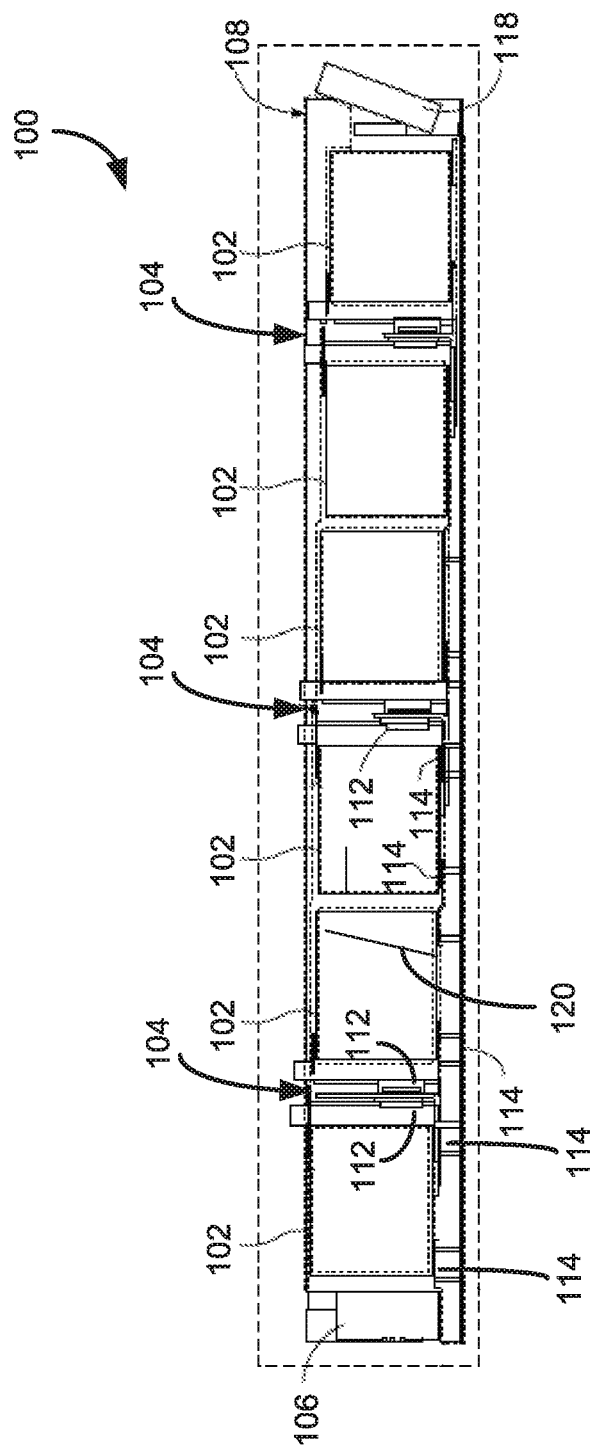
FIG. 2 is a side elevation view of the data storage module of FIG. 1.

FIG. 2 illustrates a side elevation view of the data storage module 100 of FIG. 1 having carrierless mass storage devices 102 installed on multiple vertically-oriented backplanes 104. The chassis 108 at least partially encompasses an interior of the data storage module 100. The at least partially-encompassed interior is also referred to hereinafter as a "chassis interior." Various components are coupled to the chassis in the chassis interior, including one or more power supply units 106 and backplanes 104 to which the carrierless mass storage devices 102 are installed against their opposite vertical faces.

In the illustrated embodiment, three separate vertically-oriented backplanes 104 are coupled to the chassis 108 in the chassis interior, and each backplane is coupled with at least one carrierless mass storage device 102 on each of its opposite vertical faces. In some embodiments, a backplane may be configured to couple with at least one carrierless mass storage device on a single vertical face of the backplane.

Each carrierless mass storage device 202 can be of any size and shape, but is typically approximately a rectangular prism having dimensions that can be described as a length L, a width W (FIG. 3A) and a height H (FIG. 3B). Typically, the carrierless mass storage device 202 is a commonly available hard disk drive provided without a carrier (i.e., a carrierless hard disk drive) and conforming to a recognized specification that includes specified dimensions. For example, some specifications state that qualifying hard disk drive form factors must have dimensions not exceeding set maximum length, width and height dimensions. One example of such a standard is the 3.5" Form Factor Drive Dimensions as specified in SFF-8301. It should be noted that some conventional carrierless mass storage devices 202 may depart from one or more of the maximum dimensions over relatively small areas, and thus depart from the geometry of an ideal rectangular prism, but the retainer assemblies described herein are configured to be compatible with such carrierless mass storage devices 202. In some cases, the carrierless mass storage device 202 can also be a solid state drive (SSD) provided without a carrier (i.e., a carrierless solid state drive).

The carrierless mass storage devices 202 in their vertical orientation as shown can be described as being supported on one of their pair of opposing narrower, longer surfaces (i.e., a side surface), having opposing end surfaces oriented generally vertically (and separated by the length L) and having opposing wider surfaces (i.e., side surfaces) also oriented generally vertically (and separated by the height H). The connection end surface faces the backplane. There may be a fewer or a greater number of devices than is illustrated for the data storage module 100, and the module may extend across multiple vertically and/or horizontally adjacent chassis or similar structures, as well as across multiple data storage modules that are linked together.

A retainer assembly 200 for a carrierless mass storage device according to a first implementation is shown in FIGS. 3A-3D and 440. As shown in the side elevation view of FIG. 3A, a user U is lowering a carrierless mass storage device 202 into a carrierless mass storage device receiving space, which typically includes at least a generally horizontal supporting surface 204, or a receiving surface, as it is alternatively referred to herein, and a backplane 206 extending generally vertically relative to the supporting surface 204. The backplane 206 has a connector 207 that connects with a corresponding connector on the carrierless mass storage device 202 when the carrierless mass storage device 202 is installed on the backplane 206. (Although the corresponding connector on the carrierless mass storage device is illustrated in a specific position on the end surface, it could be oriented at any point along that surface.)

There is a retainer 208 positioned at one end of the supporting surface 204. The retainer can include a bail 210 shaped to extend around the carrierless mass storage device 202. Referring to the end elevation view FIG. 3B, it can be seen that the carrierless mass storage device being lowered into position is very closely spaced to other carrierless mass storage devices 202 on either side.

Figure 6:
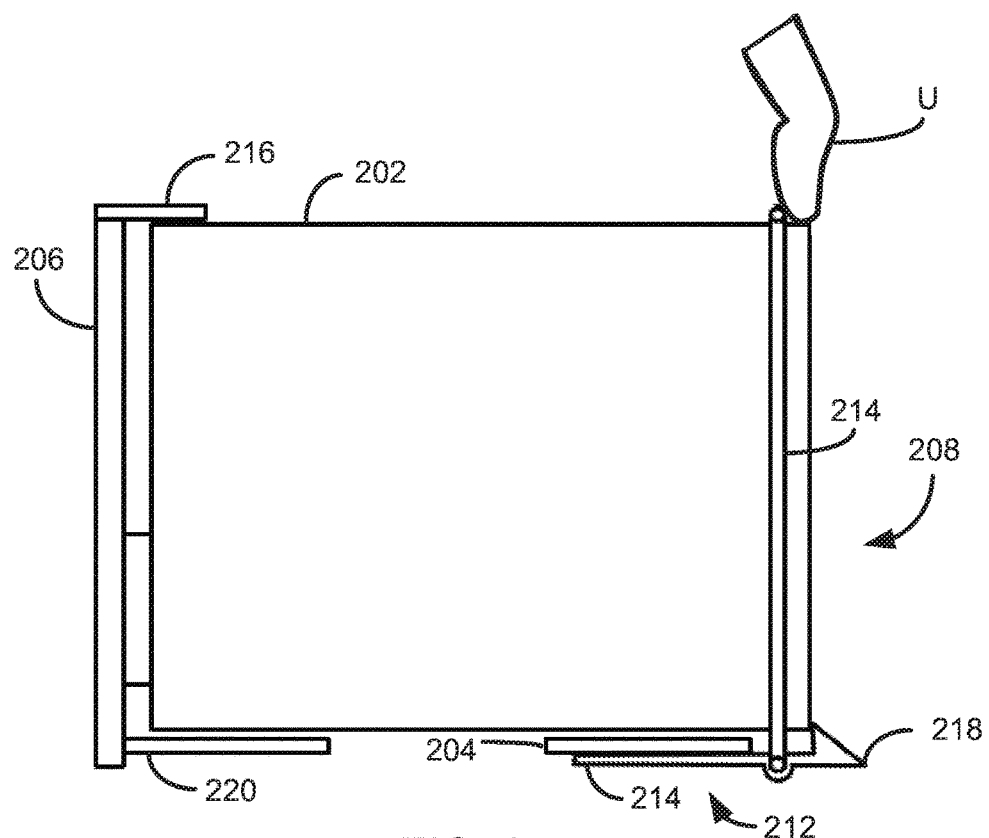
FIG. 6 is a side elevation view showing the retainer after the user has finished moving it to the engaged position.

In a first implementation, the retainer 208 is spring-biased to a disengaged position as shown, e.g., in FIG. 3A, and the user overcomes the spring bias when the retainer is moved from the disengaged position to an engaged position (see, e.g., FIG. 6). In some implementations, the retainer 208 has an end surface retaining element 212 having a first end 214 coupled to the supporting surface 204, such as by being pivotably coupled to an underside 217 of the supporting surface 204 as shown. The end surface retaining element 212 can have a distal second end 218 shaped to contact an end surface of the carrierless mass storage device 202 when the carrierless mass storage device 202 is in the installed position (FIG. 6). As illustrated, the distal second end can be normally biased away from the supporting surface 204.

The retainer 208 can also include a side surface retaining element 214 that extends from the end surface retaining element 212. Conveniently, the side surface retaining element 214 is rigidly attached to the end surface retaining element 212. As shown, e.g., in FIG. 3A, the retainer 208 can be configured such that the side surface retaining element 214 is moved out of the way when the retainer is in the disengaged position.

Overall, the retainer 208 can be described as having a hoop shape with a pair of side portions shaped to be positioned along opposite surfaces of the carrierless mass storage device 202 and a top portion that connects the side portions. In addition to the supporting surface 204, in some implementations the retainer assembly 200 includes a retaining surface 216. The retaining surface 216 is oriented generally horizontally and is positioned adjacent the backplane 206. The retaining surface 216 is spaced from the supporting surface 204 to define an end surface receiving space dimensioned to receive an end surface of the carrierless mass storage device 202. In addition, the retaining surface 216 can be dimensioned to protect the connector 207. Specifically, the retaining surface 216 can be dimensioned to extend rearwardly to a sufficient distance to prevent the carrierless mass storage device 202 from being dropped or pushed vertically downward, which could cause it to contact and damage the connector 207. As shown in FIGS. 3C and 3D, the carrierless mass storage device has been lowered into position against the supporting surface 204. The supporting surface 204 can be configured as shown, or it can include an extension 220 that is spaced apart, or it can be a continuous surface.

Figure 4:
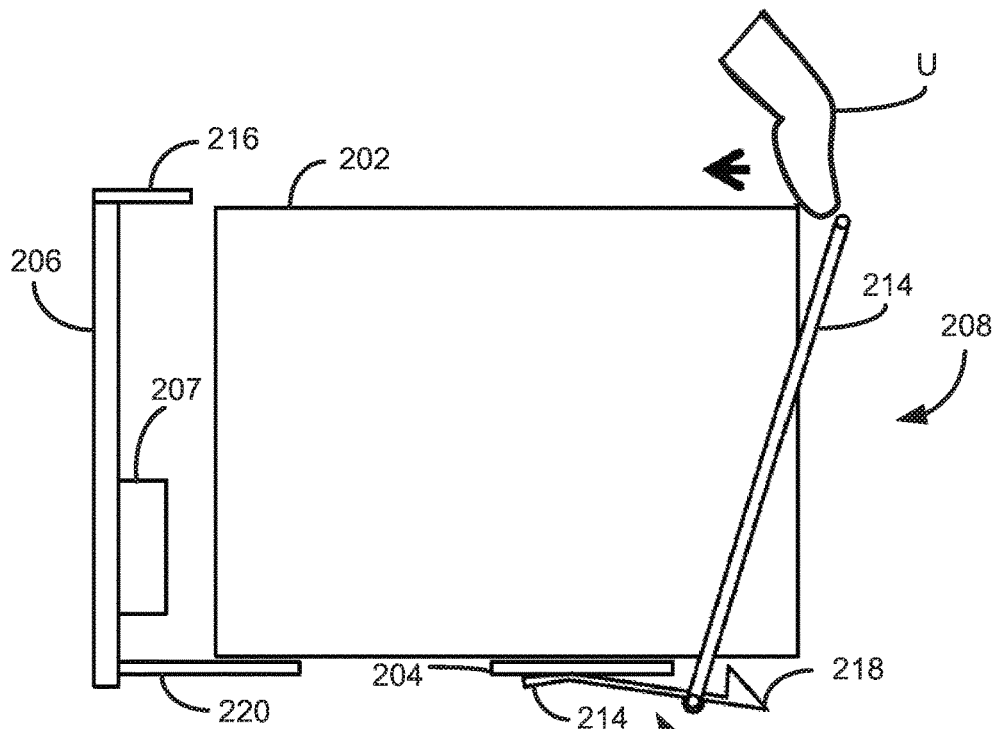
FIG. 4 is side elevation view of the carrierless mass storage device as the user is urging it horizontally towards a backplane.
Figure 5:
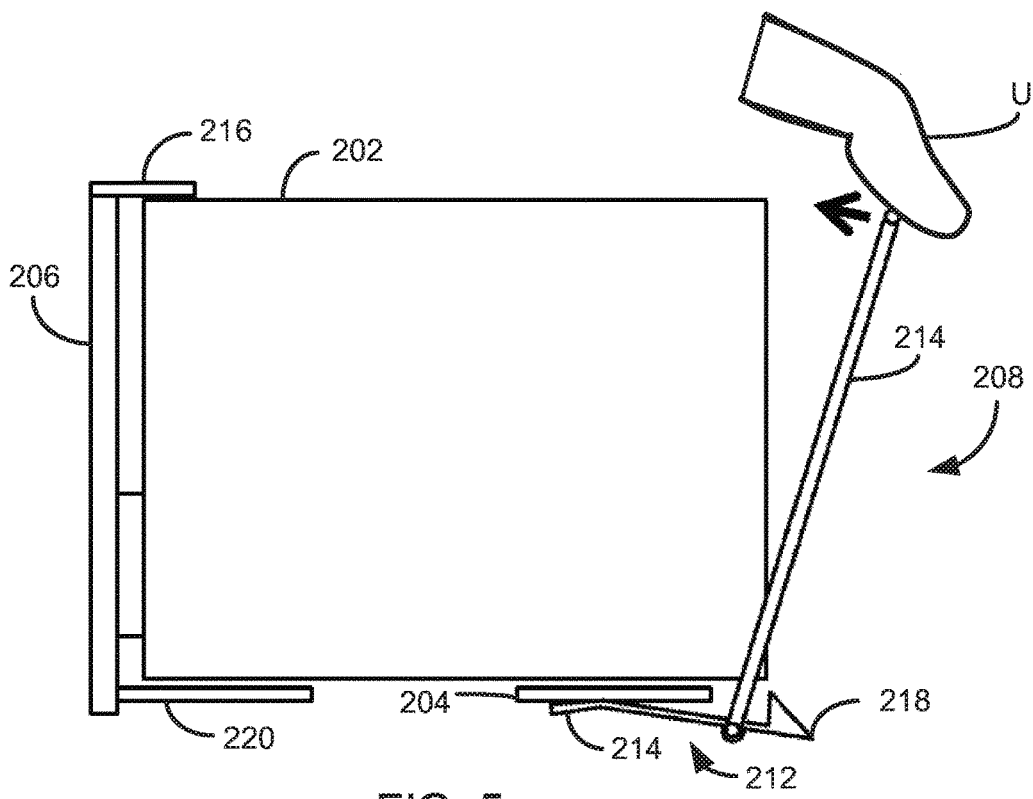
FIG. 5 is side elevation view of the carrierless mass storage device in an installed position with its connector engaged with a corresponding connector on the backplane and showing the user beginning to move the retainer towards its engaged position.

As shown in FIG. 4, the user is urging the carrierless mass storage device 202 along the supporting surface 204, eventually engaging its connector with the connector 207 of the backplane 206, as shown in FIG. 5. As also shown in FIG. 5, the user has started to move the retainer 208 from the disengaged position. It should be noted that contact between the connector 207 and the carrierless mass storage device 202 (generally at a corresponding connector) can be configured to contribute to retaining the carrierless mass storage device 202 in the installed position. As shown in FIG. 6, the retainer 208 has been moved to the engaged position to secure the carrierless mass storage device 202 in its installed position against the backplane 206.

Figure 7:
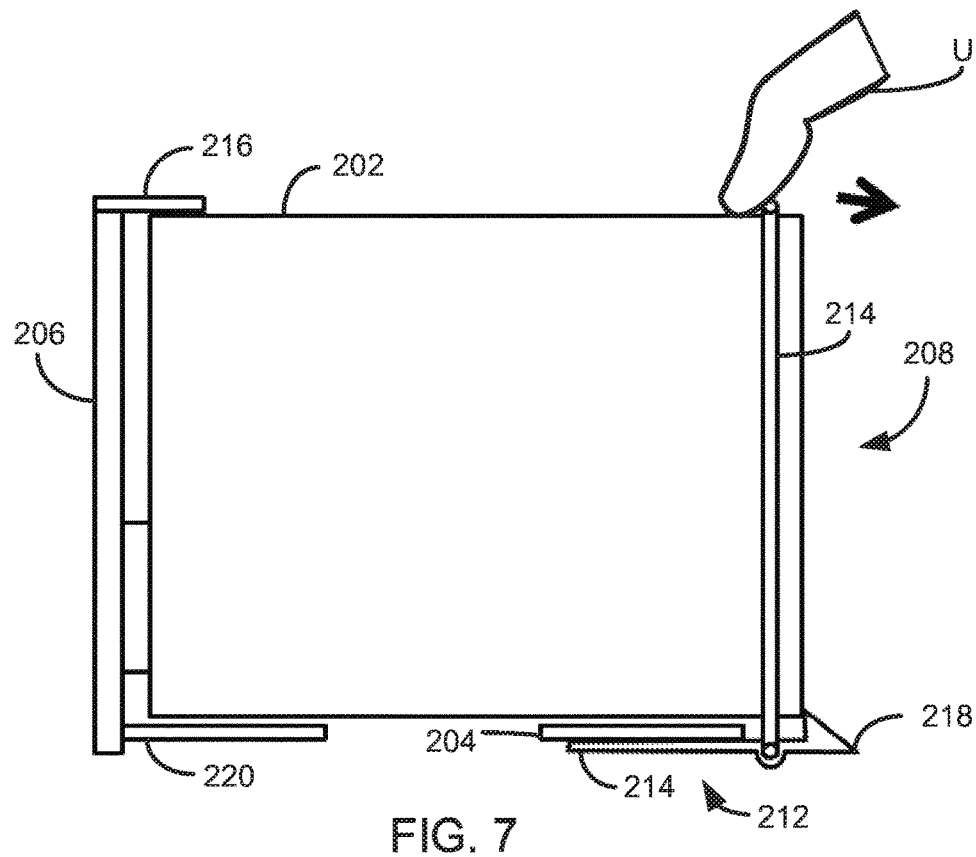
FIGS. 7, 8, 9 and 10 are additional side elevation views showing the retainer and carrierless mass storage device in different positions over a sequence of movements to remove the carrierless mass storage device.
Figure 8:
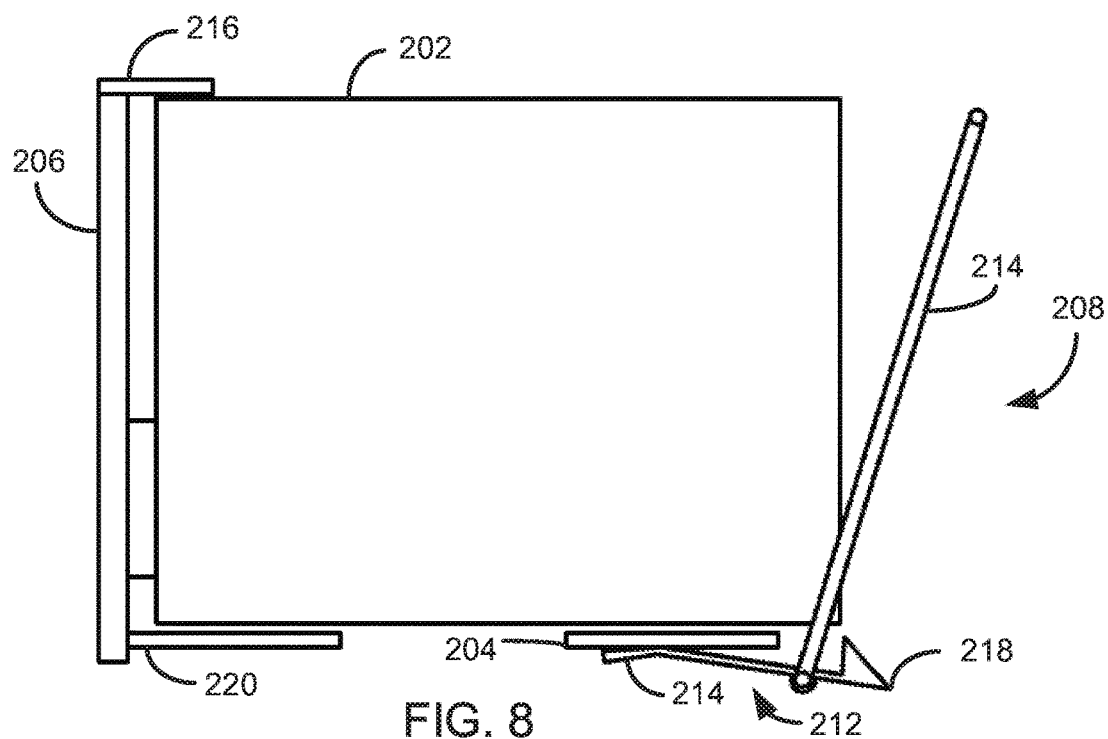
Figure 9:
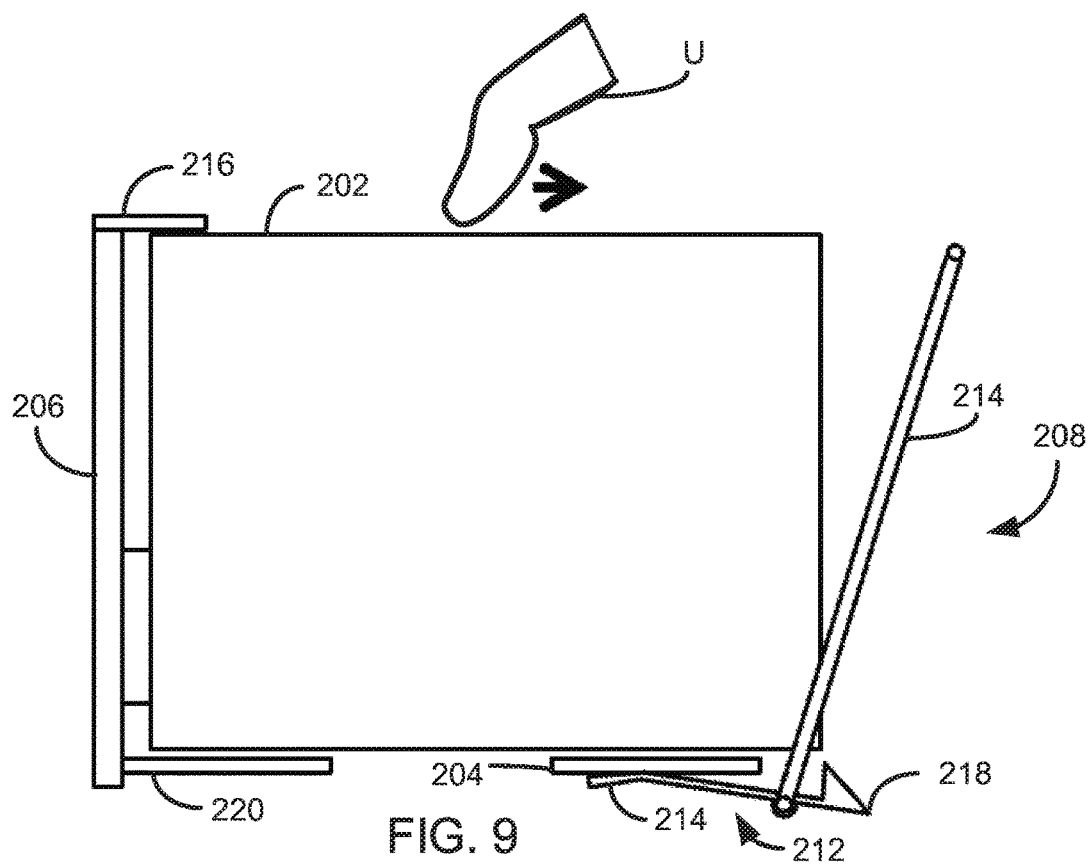
Figure 10:
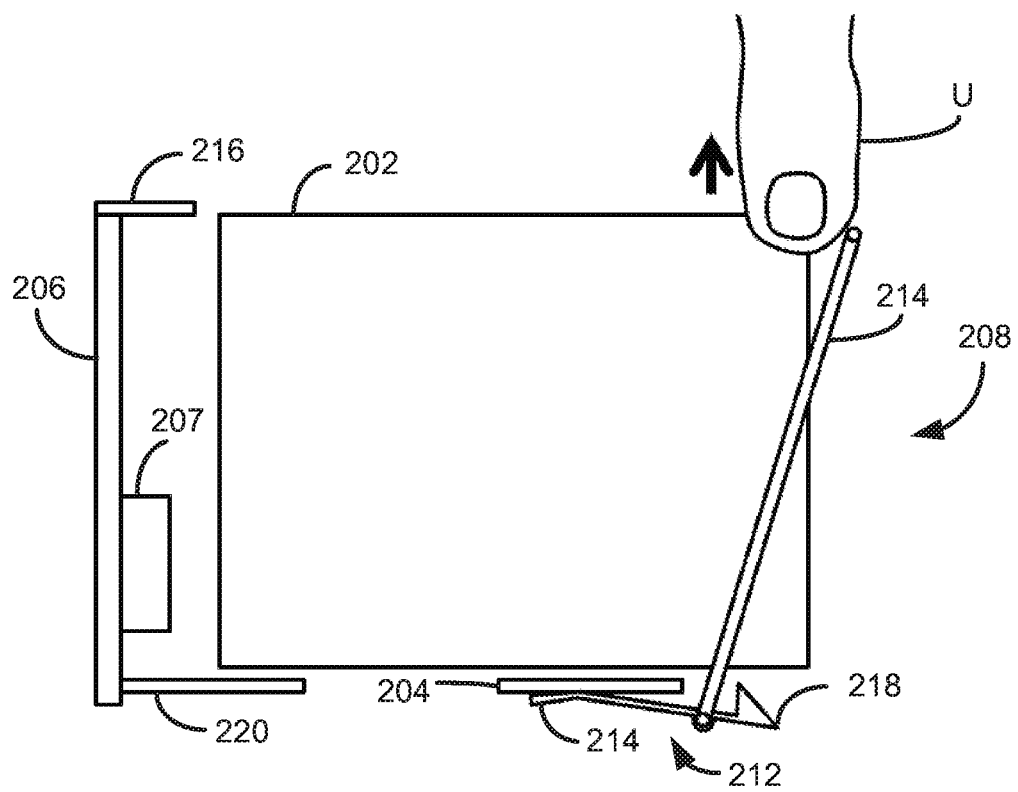

When desired, the user can remove the carrierless mass storage device 202 from the retainer assembly by generally reversing the installation steps. As shown in FIG. 7, the retainer 208 is moved from the engaged position to the disengaged position shown in FIG. 8. The user then urges the carrierless mass storage device 202 away from the backplane 206 (FIG. 9), which allows the user to grasp a protruding corner of the carrierless mass storage device 202 and remove it (FIG. 10).

Figure 11A:
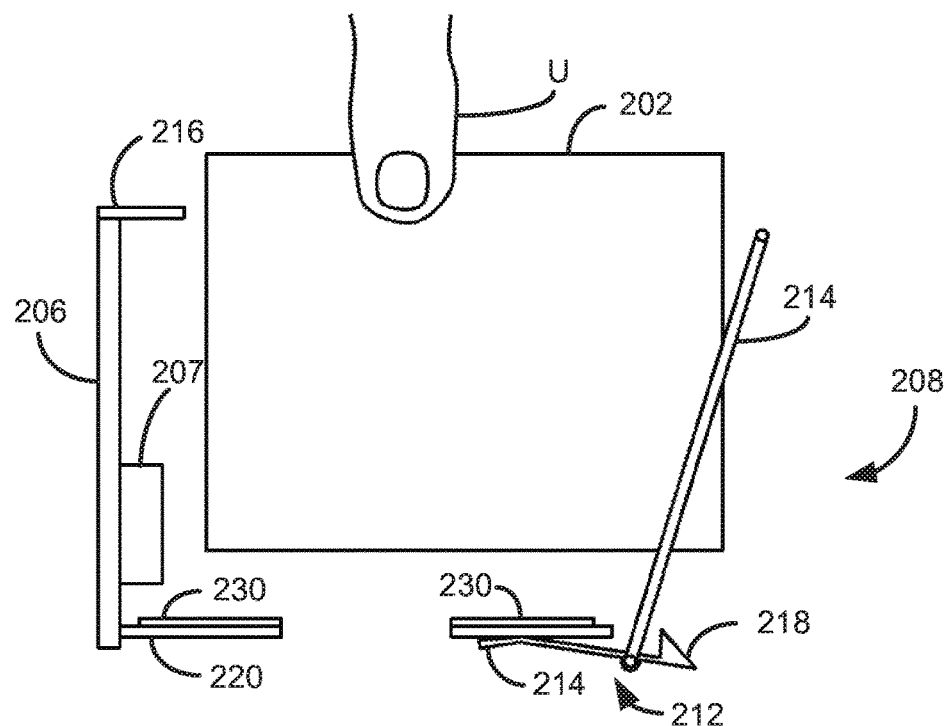
FIGS. 11A and 11B are side elevation and end elevation views showing a retainer having vibration damping.
Figure 11B:
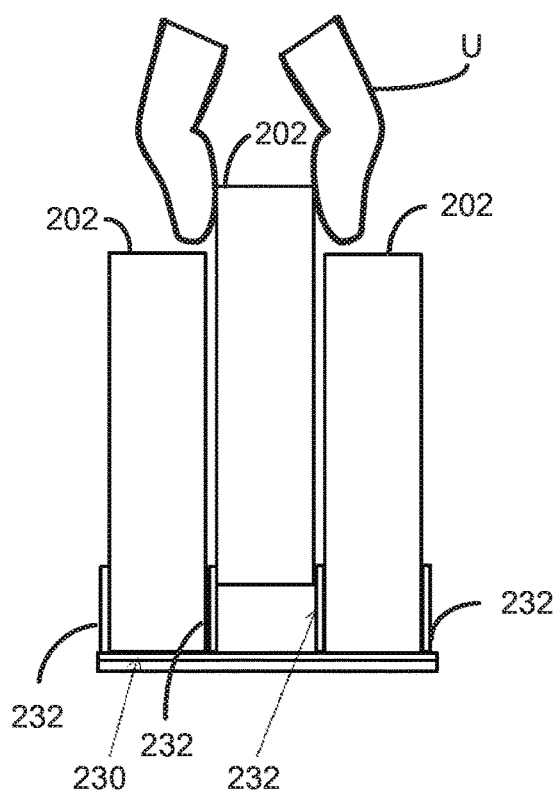

In some implementations, a damper for damping vibrations and/or shocks is provided. According to one implementation, the supporting surface 204 (or the carrierless mass storage device itself) is fitted with a resilient, shock-absorbing material 230 as shown in FIG. 11A. In some implementations, as shown in FIG. 11B, there is at least one upwardly extending separating surface 232 between adjacent carrierless mass storage devices 202. The separating surfaces 232 can also be provided the shock-absorbing material 230 or other suitable damper. In FIGS. 12A and 12B, separating surfaces 232 are made of a relatively rigid material, such as metal, and have an added soft material 234. FIG. 12C is an end elevation view showing separating surfaces 232 made of metal and having added soft material 234 on contacting surfaces.

Figure 13:
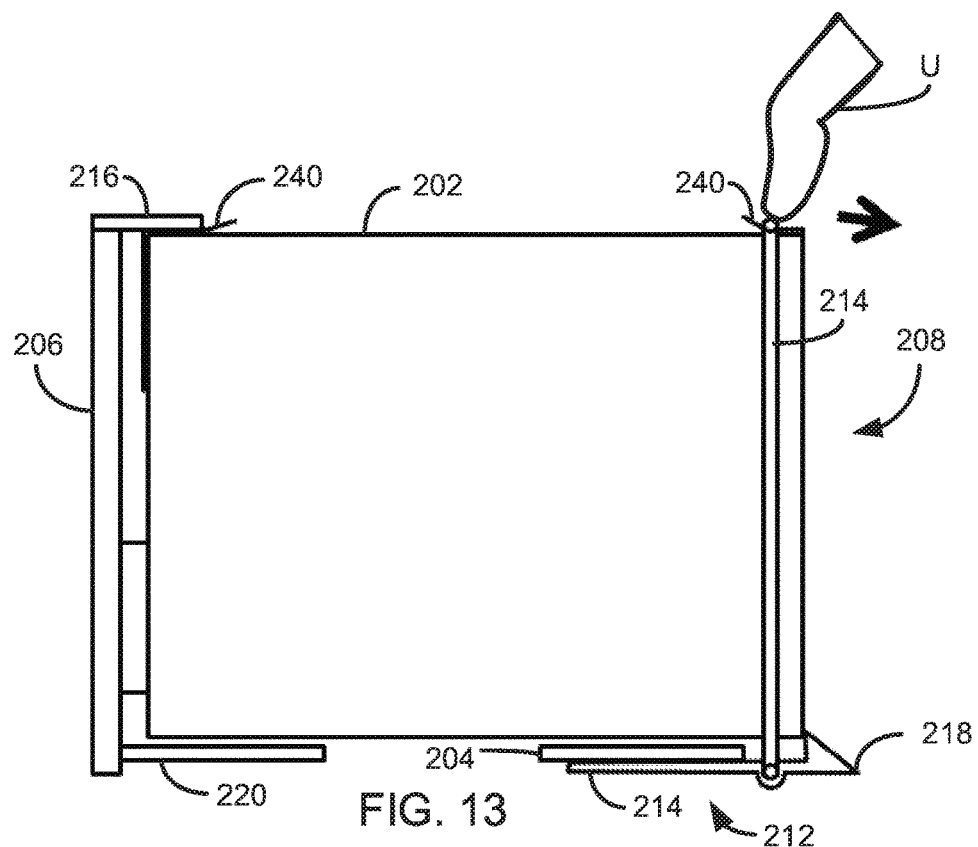
FIG. 13 is a side elevation view of a retainer in which one or more pull tabs are added to the carrierless mass storage device.
Figure 14:
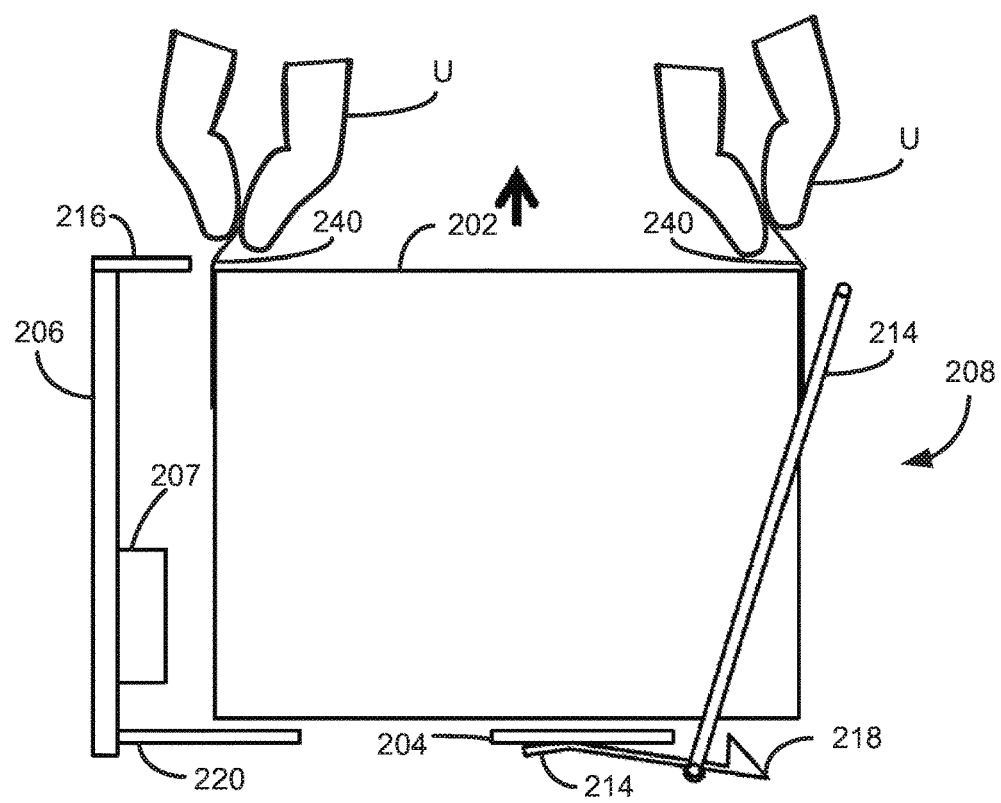
FIG. 14 is a side elevation view of the retainer of FIG. 13 showing a user using the pull tabs to remove the carrierless mass storage device.

In some implementations, the retainer assembly 200 includes one or more pull tabs 240 attached to the carrierless mass storage device 202 to provide the user with a graspable projection for removing the carrierless mass storage device 202. FIG. 13 shows a carrierless mass storage device 202 in the installed position with the retainer 208 in the engaged position and having two pull tabs 240. A first of the pull tabs 240 is attached to the end surface of the carrierless mass storage device 202 adjacent the backplane 206. This pull tab 240 is shown folded over between the retaining surface 216 and the carrierless mass storage device 202. A second of the pull tabs 240 is attached to the opposite end surface of the carrierless mass storage device 202, and is shown folded over between the retainer 208 and the carrierless mass storage device 202. In some implementations, the pull tabs can be formed of adhesive MYLAR® tape or other similar material. As shown in FIG. 14, when the retainer 208 has been moved to the disengaged position and the carrierless mass storage device 202 has been urged away from the backplane 206, the pull tabs are freed and the user can grasp them to assist in the removal of the carrierless mass storage device 202.

Figure 15:
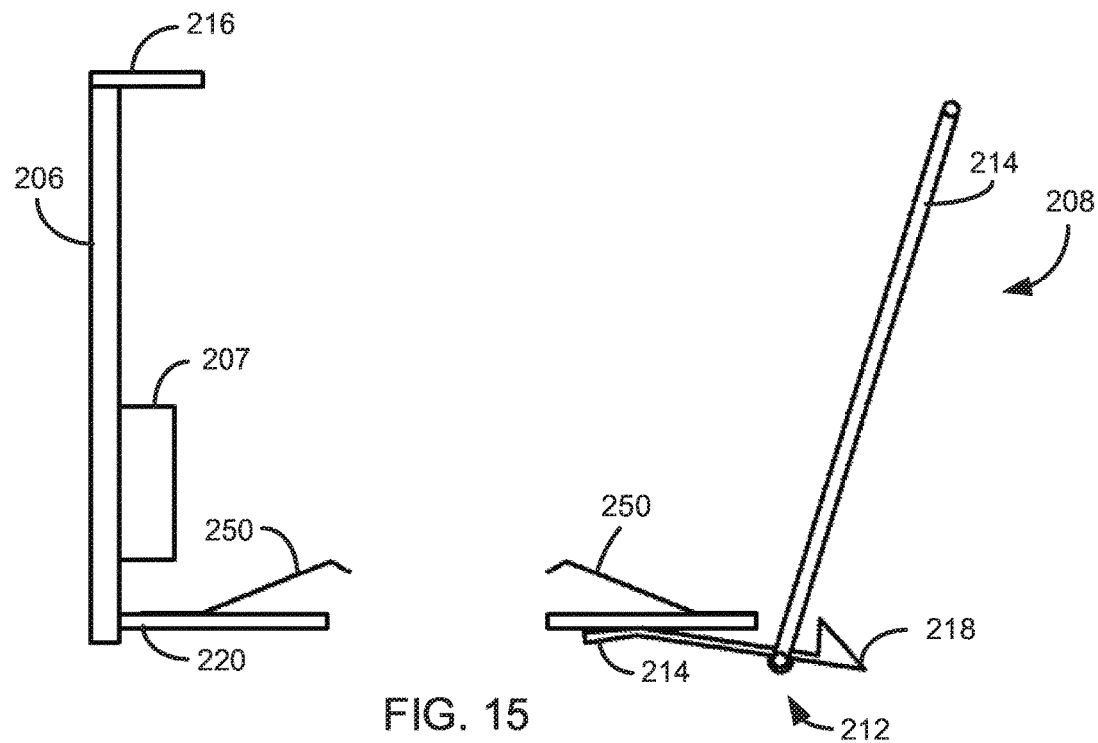
FIG. 15 is a side elevation view of a retainer having one or more spring elements, such as on the supporting surface.
Figure 16:
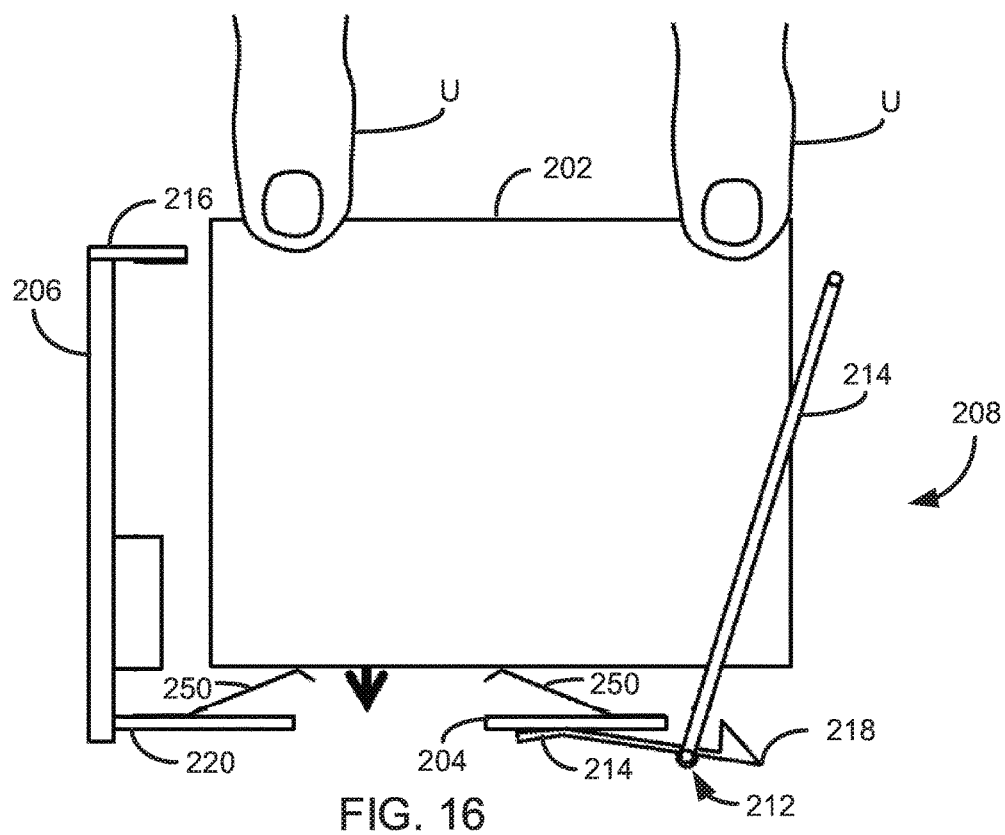
FIGS. 16-21 are side elevation views of the retainer of FIG. 15 showing a sequence of movements in which a carrierless mass storage device is installed in the retainer and then removed from the retainer.
Figure 17:
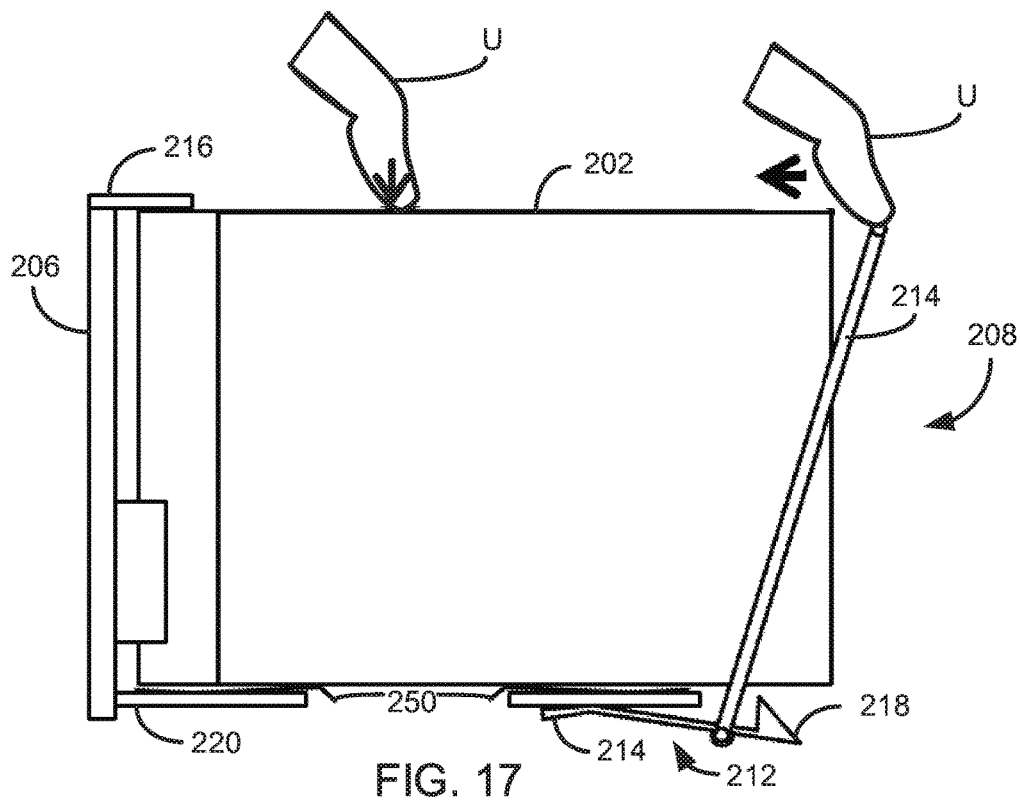
Figure 18:
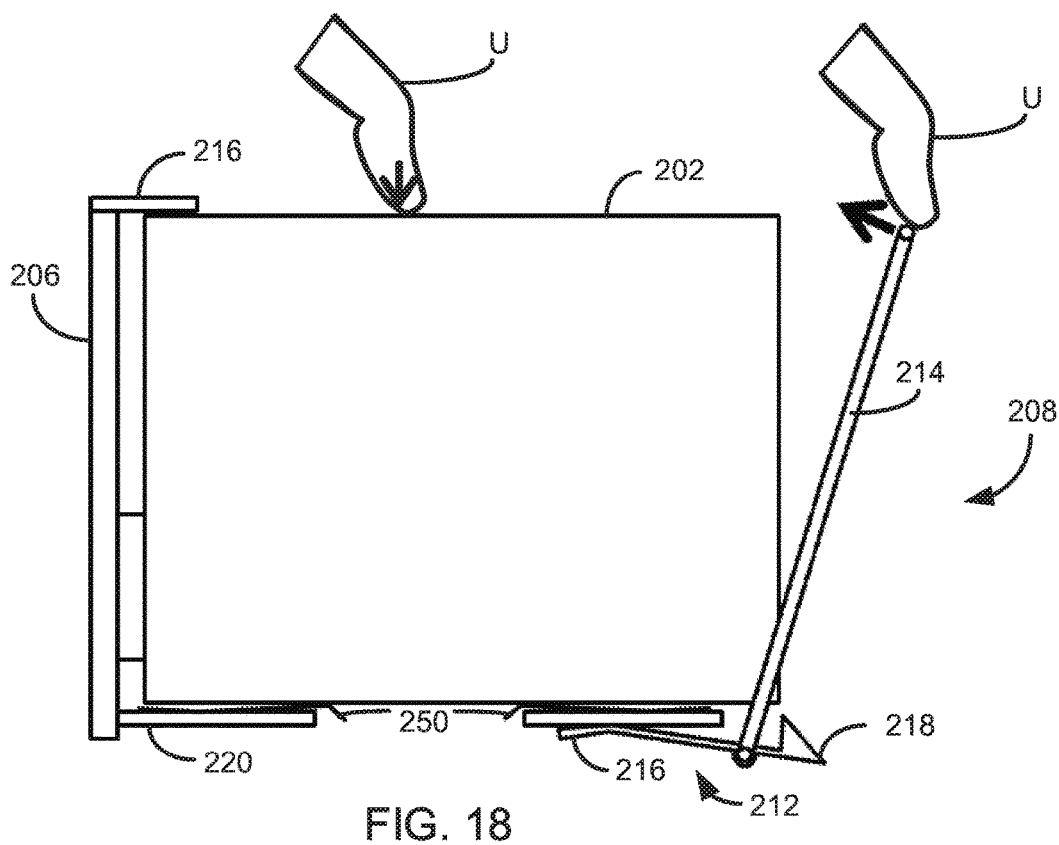
Figure 19:
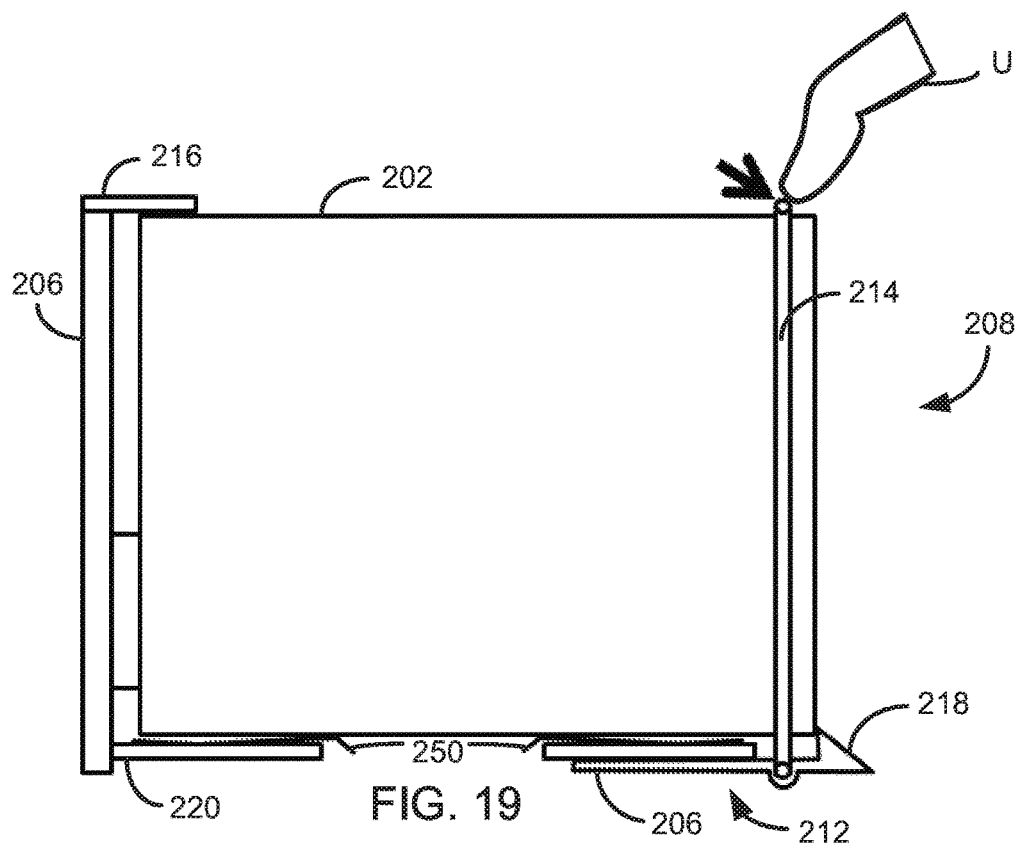

In some implementations, the retainer assembly 200 includes one or more spring elements, which are attached to the supporting surface 204 to absorb shock and/or to assist in positioning the carrierless mass storage device 202 for easier removal. Referring to FIG. 15, the retainer assembly 200 can include one or spring elements, such as leaf springs 250 mounted to the supporting surface 204. The leaf spring 250 can be configured to provide a force oriented generally vertically upward. The leaf spring 250 can have a first end connected to the supporting surface 204 and a distal second end extending away from the supporting surface 204. As shown in FIG. 16, as the carrierless mass storage device 202 is lowered into position, it contacts the leaf springs 250, and the leaf springs tend to absorb some of the downward forces exerted during installation. In FIG. 17, the user applies a controlled downward force to compress the leaf springs 250 against the supporting surface as the carrierless mass storage device 202 is moved into the installation position and the retainer is moved to the engaged position (FIGS. 18 and 19). The leaf springs 250 can be configured to provide a predetermined spring force in their compressed state to counteract vibrations and/or hold the carrierless mass storage device 202 more securely.

Figure 20:
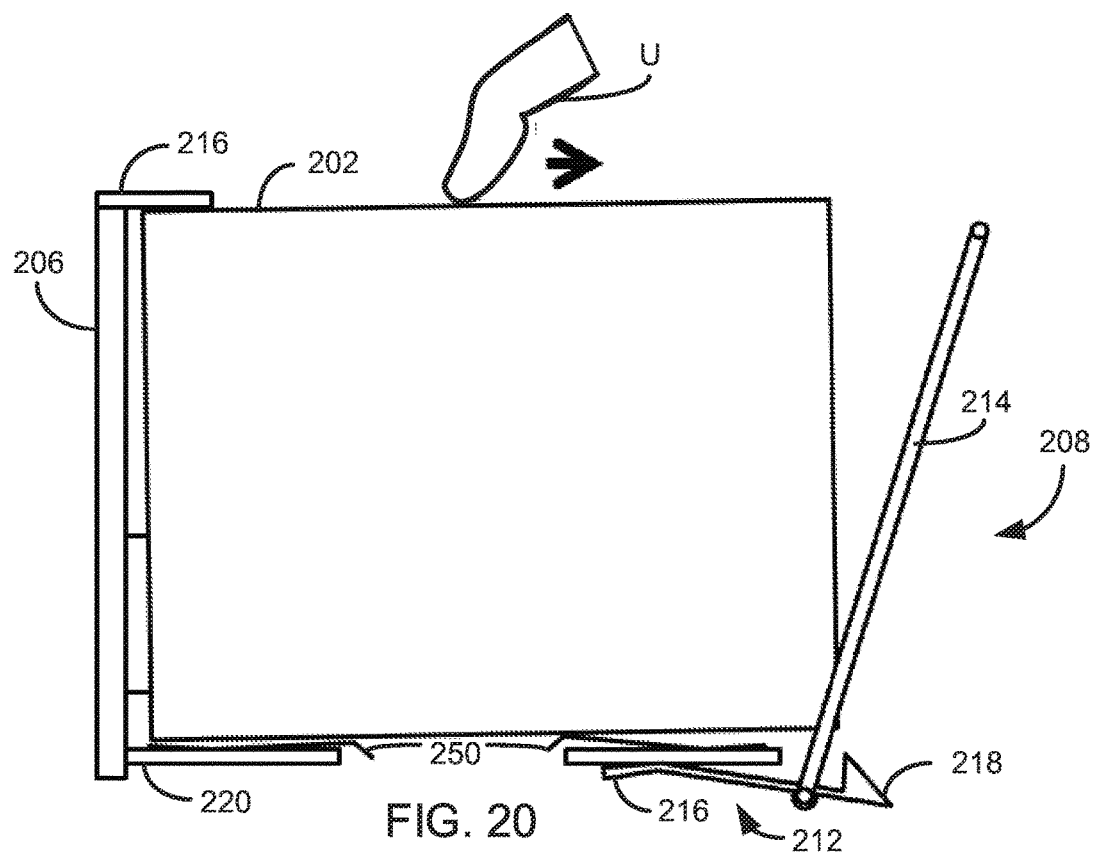
Figure 21:
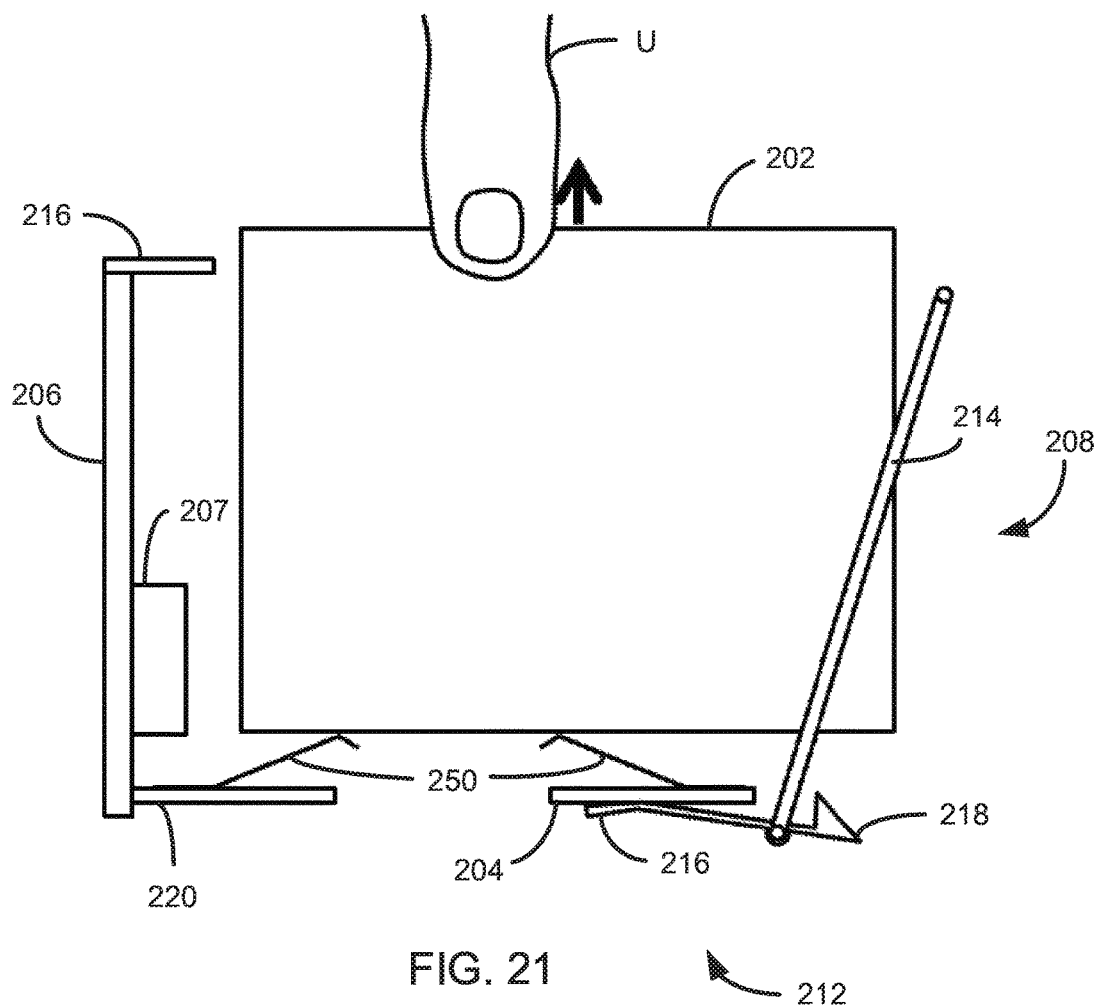

To remove the carrierless mass storage device 202, the installation steps are generally reversed. The user moves the retainer 208 to the disengaged position (FIG. 19), and moves the carrierless mass storage device 202 away from the backplane 206 (FIG. 20). With the retainer 208 disengaged, the leaf springs 250 tend to lift the carrierless mass storage device 202 such that the user can grasp it more readily, especially among an array of other closely spaced carrierless mass storage devices.

Although the above implementations have sometimes been described for a carrierless mass storage device positioned in a generally vertical orientation, generally understood to mean that the largest surfaces of the mass storage device are positioned generally vertically and the longer, narrower side surfaces are positioned horizontally, it would also be possible to configure the retainer assembly for use with a mass storage device in a generally horizontal orientation. Further, the retainer assembly can be configured for positioning to hold mass storage devices in orientations other than a generally vertical or a generally horizontal orientation, such as an angled orientation.

General Considerations

As used herein, "air moving device" includes any device, element, system, or combination thereof that can move air. Examples of air moving devices include fans, blowers, and compressed air systems.

As used herein, an "aisle" means a space next to one or more elements, devices, or racks.

As used herein, "backplane" means a plate or board to which other electronic components, such as mass storage devices, circuit boards, can be mounted. In some embodiments, mass storage devices, which can include on or more carrierless hard disk drives and/or other types of carrierless mass storage devices, are plugged into a backplane in a generally perpendicular orientation relative to the face of the backplane. In some embodiments, a backplane includes and one or more power buses that can transmit power to components on the backplane, and one or more data buses that can transmit data to and from components installed on the backplane.

As used herein, "ambient" means, with respect to a system or facility, the air surrounding at least a portion of the system or facility. For example, with respect to a data center, ambient air may be air outside the data center, for example, at or near an intake hood of an air handling system for the data center.

As used herein, a "cable" includes any cable, conduit, or line that carries one or more conductors and that is flexible over at least a portion of its length. A cable may include a connector portion, such as a plug, at one or more of its ends.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "data center module" means a module that includes, or is suitable for housing and/or physically supporting, one or more computer systems that can provide computing resources for a data center.

As used herein, "member" includes a single element or a combination of two or more elements (for example, a member can include two or more sheet metal parts fastened to one another.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "mounting" a particular element on another element refers to positioning the particular element to be in physical contact with the other element, such that the other element provides one or more of structural support, positioning, structural load transfer, stabilization, shock absorption, some combination thereof, or the like with regard to the particular element. The mounted particular element may be positioned to rest upon one or more upper surfaces of the other element, independent of coupling the elements via one or more coupling elements. In some embodiments, mounting the particular element to another element includes coupling the elements such that the other element provides one or more of structural support, positioning, structural load transfer, stabilization, shock absorption, some combination thereof, or the like with regard to the particular element.

As used herein, "installing" a particular element on another element refers to physically coupling the elements such that the particular element is communicatively coupled with at least the other element. Installing the elements can include electrically coupling the elements via physically coupling an electrical connector of the particular element with a complementary electrical connector of the other element. Installing a particular element to another element can include electrically coupling a portion of the particular element to a portion of the other element and mounting another portion of the particular element to another portion of the other element.

As used herein, "primarily horizontal," also interchangeably referred to hereinafter as "horizontally-oriented," means at least more horizontal than vertical. In the context of an installed element or device, "primarily horizontal" or "horizontally oriented" includes an element or device whose installed width is greater than its installed height. In some embodiments, a horizontally-oriented element or device is fully horizontal.

As used herein, "primarily vertical," also interchangeably referred to hereinafter as "vertically-oriented," means at least more vertical than horizontal. In the context of an installed element or device, "primarily vertical" or "vertically-oriented" includes an element or device whose installed height is greater than its installed width. In the context of a hard disk drive, "primarily vertical" or "vertically-oriented" includes a hard disk drive that is installed such that the installed height of the hard disk drive is greater than the installed width of the hard disk drive. In some embodiments, a vertically-oriented element or device is fully vertical.

As used herein, a "rack" means a rack, container, frame, or other element or combination of elements that can contain or physically support one or more computer systems.

As used herein, "room" means a room or a space of a building. As used herein, "computer room" means a room of a building in which computer systems, such as rack-mounted servers, are operated.

As used herein, a "space" means a space, area or volume.

As used herein, "shelf" means any element or combination of elements on which an object can be rested. A shelf may include, for example, a plate, a sheet, a tray, a disc, a block, a grid, or a box. A shelf may be rectangular, square, round, or another shape. In some embodiments, a shelf may be one or more rails.

As used herein, "shock absorbing," as applied to a supporting element for another element, means that the supporting element absorbs mechanical energy and/or at least partially mitigates shock and/or vibration loads. A shock-absorbing material may be elastic, viscoelastic, viscous, or combinations thereof.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

What is claimed is:

1. A carrierless mass storage device retainer assembly for retaining a carrierless mass storage device, comprising:
   an electronics components chassis defining a receiving surface configured to receive a first narrow side surface of a carrierless mass storage device inserted into the chassis in a first direction transverse to the receiving surface, the carrierless mass storage device having an opposing second narrow side surface facing in a direction generally perpendicular relative to the receiving surface;
   a connection surface for positioning generally perpendicular relative to the receiving surface, the connection surface having a connector configured to establish a connection between the connector and a first end surface of the carrierless mass storage device, wherein the receiving surface supports the carrierless mass storage device as the carrierless mass storage device is moved along the receiving surface in a second direction perpendicular to the first direction and towards the connector to establish the connection and position the carrierless mass storage device in an installed position;
   a retaining surface protruding from the connection surface and extending generally perpendicularly from the connection surface and generally parallel to the receiving surface, wherein the retaining surface is spaced apart from the receiving surface to define an end surface receiving space therebetween dimensioned to receive the first end surface of the carrierless mass storage device in a vertical orientation; and
   a retainer coupled to and extending away from the receiving surface, the retainer comprising a distal end shaped to contact the second narrow side surface of the carrierless mass storage device when the carrierless mass storage device is in the installed position.

2. The carrierless mass storage device retainer assembly of claim 1, wherein the distal end of the retainer comprises an end surface retaining element having a first end pivotably coupled to the receiving surface and a distal second end shaped to contact an end surface of the carrierless mass storage device when the carrierless mass storage device is in the installed position.

3. The carrierless mass storage device retainer assembly of claim 2, wherein the second end of the end surface retaining element is normally biased away from the receiving surface.

4. The carrierless mass storage device retainer assembly of claim 2, further comprising side portions rigidly connected to the end surface receiving element at a position between the first end and the second end, the side portions extending at an angle away from the end surface retaining element and being shaped for positioning along respective vertically extending wide surfaces of the carrierless mass storage device that face laterally in the installed position.

5. The carrierless mass storage device retainer assembly of claim 1, wherein the retainer is hoop-shaped and comprises a pair of side portions shaped to be positioned along respective vertically extending wide surfaces of the carrierless mass storage device that face laterally in the installed position.

6. The carrierless mass storage device retainer assembly of claim 1, wherein the connector protrudes from the connection surface, and wherein the retaining surface extends by a distance sufficient to at least partially overlie the connector, thereby preventing the carrierless mass storage device from falling in the first direction during installation and striking the connector.

7. The carrierless mass storage device retainer assembly of claim 1, wherein the receiving surface comprises a damper.

8. The carrierless mass storage device retainer assembly of claim 1, wherein the receiving surface comprises a resilient material selected to absorb shock or vibrations.

9. The carrierless mass storage device retainer assembly of claim 1, wherein the carrierless mass storage device is a first carrierless mass storage device, and wherein the receiving surface comprises at least one projecting separating surface for separating the first carrierless mass storage device from a second adjacent carrierless mass storage device.

10. The carrierless mass storage device retainer assembly of claim 9, wherein the separating surface comprises a resilient material selected to absorb shock and/or vibrations.

11. The carrierless mass storage device retainer assembly of claim 1, further comprising at least one pull tab connectable to the carrierless mass storage device, the pull tab being positionable on the carrierless mass storage device with a free end extending away from the carrierless mass storage device and defining a user-graspable area.

12. The carrierless mass storage device retainer assembly of claim 1, further comprising at least one spring element positioned on the receiving surface, the spring element being configured to exert a spring force in a direction generally opposite a force exerted by the carrierless mass storage device upon insertion into the chassis.

13. The carrierless mass storage device retainer assembly of claim 12, wherein the at least one spring element is a first spring element and the first spring element is positioned on the receiving surface adjacent the connection surface, further comprising a second spring element positioned at an opposite end of the receiving surface.

14. The carrierless mass storage device retainer assembly of claim 12, wherein the spring element is a leaf spring with a first end connected to the receiving surface and a distal second end extending away from the receiving surface and positioned to contact the carrierless mass storage device in the installed position.

15. The carrierless mass storage device retainer assembly of claim 1, wherein the receiving surface comprises a first segment positioned adjacent the connection surface and a second segment spaced apart from the first segment by a gap.

16. The carrierless mass storage device retainer assembly of claim 1, further comprising at least one spring element positioned on the receiving surface and configured to partially counteract forces exerted when the carrierless mass storage device is lowered into the receiving area and to urge the carrierless mass storage device upward when the retainer is moved from an engaged position to an disengaged position.

17. The carrierless mass storage device retainer assembly of claim 1, wherein the retainer is spring biased.

* * * * *